(12) United States Patent
Dubois et al.

(10) Patent No.: US 10,741,740 B2
(45) Date of Patent: Aug. 11, 2020

(54) THERMO-ELECTRIC GENERATOR

(71) Applicant: STMicroelectronics (Crolles 2) SAS, Crolles (FR)

(72) Inventors: Emmanuel Dubois, Quesnoy sur Deule (FR); Jean-Francois Robillard, La Madeleine (FR); Stephane Monfray, Eybens (FR); Thomas Skotnicki, Crolles-Montfort (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 194 days.

(21) Appl. No.: 16/047,505

(22) Filed: Jul. 27, 2018

(65) Prior Publication Data

US 2018/0358535 A1 Dec. 13, 2018

Related U.S. Application Data

(63) Continuation of application No. 14/851,536, filed on Sep. 11, 2015, now Pat. No. 10,103,310.

(30) Foreign Application Priority Data

Dec. 2, 2014 (FR) ...................................... 14 61760

(51) Int. Cl.
  *H01L 35/32* (2006.01)
  *H01L 27/16* (2006.01)
(52) U.S. Cl.
  CPC .............. *H01L 35/32* (2013.01); *H01L 27/16* (2013.01)

(58) Field of Classification Search
  CPC ......... H01L 35/00; H01L 35/02; H01L 35/32; H01L 35/22
  See application file for complete search history.

(56) References Cited

U.S. PATENT DOCUMENTS

| 2012/0017962 A1 | 1/2012 | Skotnicki et al. |
| 2013/0206199 A1 | 8/2013 | Lassiter et al. |
| 2013/0255738 A1 | 10/2013 | Mitrovic et al. |
| 2015/0034138 A1* | 2/2015 | Himmer .................. H01L 35/32 136/205 |

FOREIGN PATENT DOCUMENTS

| CN | 103180983 A | 6/2013 |
| GB | 1016102 | 1/1966 |
| JP | 2012222244 A | 11/2012 |
| JP | 2014154761 A | 8/2014 |

(Continued)

OTHER PUBLICATIONS

English machine translation of Ito (WO 2012/070395) retrieved from Google Patents on Mar. 27, 2020.*

(Continued)

*Primary Examiner* — Christina Chern
(74) *Attorney, Agent, or Firm* — Crowe & Dunlevy

(57) ABSTRACT

A thermo-electric generator includes a semiconductor membrane with a phononic structure containing at least one P-N junction. The membrane is suspended between a first support designed to be coupled to a cold thermal source and a second support designed to be coupled to a hot thermal source. The structure for suspending the membrane has an architecture allowing the heat flux to be redistributed within the plane of the membrane.

36 Claims, 6 Drawing Sheets

(56) References Cited

FOREIGN PATENT DOCUMENTS

TW           200413240 A       8/1992
WO     WO-2012070395 A1 *  5/2012   ............. H01L 35/32

OTHER PUBLICATIONS

First Office Action and Search Report from co-pending CN Appl. No. 201510614149.3 dated Aug. 16, 2017 (8 pages).
Second Office Action and Search Report for co-pending CN Appl. No. 201510614149.3 dated Mar. 20, 2018 (6 pages).
INPI Search Report and Written Opinion for FR 1461760 dated Jul. 22, 2015 (8 pages).
Kockmann, N., et al: "Microstructured In-Plane Thermoelectric Generators With Optimized Heat Path," Transducers & Eurosensors '07, The 14th International Conference on Solid-State Sensors, Actuators and Microsystems, Lyon, France, Jun. 10-14, 200, pp. 133-136.
Tarkhanyan, Roland H., et al: "Reduction of Thermal Conductivity in Porous "Gray" Materials," APL Materials 2, 076107 (2014); doi: 10.1063/1.4886220 (8 pages).
Xie, Jin et al: "Design Fabrication and Characterization of CMOS MEMS-Based Thermoelectric Power Generators," Journal of Microelectromechanical Systems, vol. 19, No. 2 (Apr. 1, 2010), pp. 317-324.

\* cited by examiner

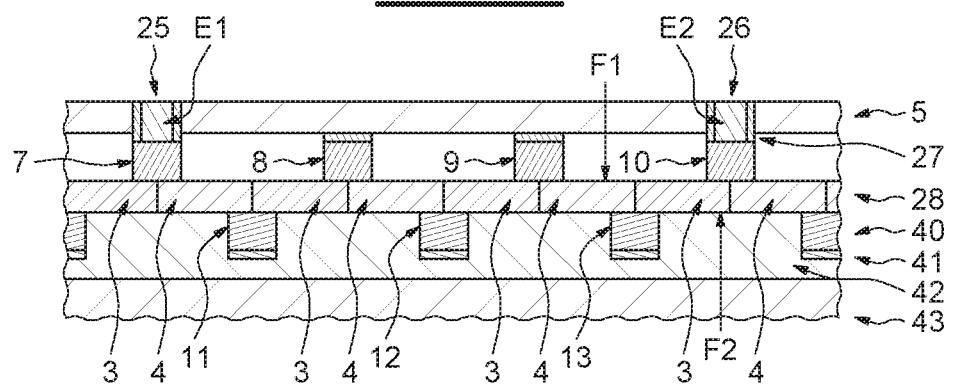
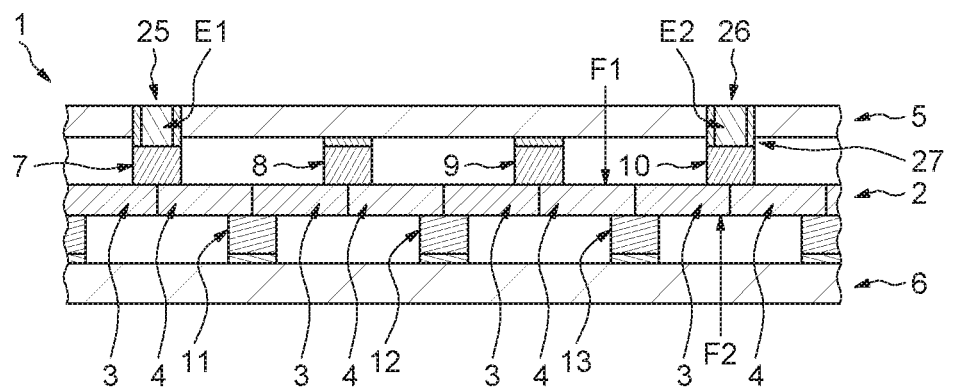

THERMO-ELECTRIC GENERATOR

CROSS REFERENCE TO RELATED APPLICATIONS

This application is a continuation of U.S. patent application Ser. No. 14/851,536 filed Sep. 11, 2015, which claims priority from French Application for Patent No 1461760 filed Dec. 2, 2014, the disclosures of which are incorporated by reference.

TECHNICAL FIELD

Embodiments relate to thermo-electric generators and, more precisely, the integrated thermo-electric generators comprising a semiconductor material. Possible applications are notably the powering of low and medium power electrical devices by virtue of the recovery of thermal energy such as:

distributed communications sensors in a fixed environment (buildings, underground) or mobile environment (motor vehicle, aircraft);

autonomous measurement devices targeting medical applications powered by the heat of the body.

The present invention could also be applied for example in the framework of the recovery/dissipation of thermal energy within microelectronic circuits.

BACKGROUND

Integrated thermo-electric generator devices generally comprise an architecture of miniaturized vertical thermopiles coupled in series and using conventional thermoelectric materials such as bismuth telluride ($Bi_2Te_3$).

However, the vertical structure of these generators and the usual thermo-electronic materials tend to be incompatible with the conventional CMOS fabrication methods.

SUMMARY

According to one embodiment, a thermo-electric generator is provided with a structure compatible with integrated manufacturing and with CMOS fabrication processes.

According to one embodiment, a thermo-electric generator is provided whose active element has an essentially planar structure, and whose architecture allows the heat flux to be redistributed within the plane of the active element.

According to another embodiment, a thermo-electric generator is provided whose active element is structured by phononic engineering and whose thermal conductivity, being very reduced in certain directions and higher in other directions, endows it with thermo-electric properties that are superior to those of the current generators.

According to one aspect, a thermo-electric generator is provided comprising a semiconductor membrane containing at least one P-N junction, this membrane being suspended between a first support designed to be coupled to a cold thermal source and a second support designed to be coupled to a hot thermal source.

The semiconductor membrane, which forms the active element of the thermo-electric generator, is by its nature an essentially planar and generally thin element, and its fabrication is readily integrated into the process of fabrication of CMOS integrated circuits.

The membrane can extend parallel to the supports, for example at equal distances from the latter.

Such a configuration of the thermo-electric generator, which differs significantly from the conventional structures of the prior art, may then be characterized as "planar", as opposed to the vertical structures of the prior art.

The supports can be rigid, for example made of metal or semiconductor material.

As a variant, the supports may be flexible which allows the generator to match a curved surface for example.

According to one embodiment, the semiconductor membrane contains several strips alternately of N and P types of conductivity forming several P-N junctions coupled in series, each P-N junction running between a first face of the membrane situated facing the first support and a second face of the membrane situated facing the second support, the membrane being suspended by suspension means comprising thermally-conducting pillars distributed in an alternating manner on the two faces of the membrane, each pillar connecting a P-N junction to the corresponding support.

The presence of several N and P strips allows the power of the thermo-electric generator to be increased and the alternating distribution of the pillars allows the heat flux to be redistributed within the plane of the membrane.

According to yet another embodiment, the thermally-conducting pillars situated on one of the faces comprise at least two pillars referred to as contact pillars, being electrically conducting, coupled to at least two places on the corresponding support so as to generate an electrical signal and isolated from the corresponding support by a thermally-conducting electrical insulator;

pillars referred to as connection pillars, being electrically conducting and electrically isolated from the corresponding support by a thermally-conducting electrical insulator.

The pillars situated on the other face only comprise connection pillars that are electrically conducting and electrically isolated from the corresponding support by a thermally-conducting electrical insulator.

It is particularly advantageous for the suspended membrane to have a phononic structure, in other words comprising a lattice of inclusions with a composition different from the semiconductor material of the membrane.

As is well known to those skilled in the art, phonons are the vibrational modes of the atoms in the crystal lattice of the silicon material.

The phononic structure is notably formed by introducing holes (artificial phononic crystal) into the membrane, for example made of silicon, so as to lead to a significant reduction in thermal conductivity. For this reason, thermoelectric properties that are superior to the current thermoelectric materials can be obtained.

A periodic lattice of inclusions is advantageously provided with at least one repetition pitch less than the mean free path of the thermal phonons and greater than the wavelength of the thermal phonons.

Indeed, the efficiency of the phononic crystal for filtering the phonons is notably determined by the repetition pitch.

In order to benefit from a cumulative effect of the filtering of the thermal phonons at various frequencies, the idea is to use a succession of different repetition pitches of increasing sizes, in other words a gradient of repetition pitches.

The use is also provided for example of a succession of inclusions of increasing sizes in order to reinforce the cumulative effect of the filtering of the thermal phonons at various frequencies.

Advantageously, the semiconductor membrane with a phononic structure may combine the two previous features (repetition pitches and inclusions of increasing sizes) in order to further increase the filtering of the thermal phonons at various frequencies and hence to further improve the performance of the thermo-electric generator.

When the semiconductor material is silicon, the inclusion repetition pitch is advantageously greater than 2 nm and less than 200 nm and the thickness of the membrane is advantageously in the range between 10 nm and 2 μm.

The lattice of inclusions is advantageously symmetrical. The symmetry of the lattice of inclusions provides an advantageous effect allowing properties dependent on the direction of propagation to be induced. The various densities of inclusions in the orientation directions within a symmetrical lattice of inclusions influence the thermal conductivities of the corresponding orientation directions. The higher the density of inclusions, the lower will be the corresponding thermal conductivity.

It is therefore preferable to have a higher density of inclusions (in other words a lower thermal conductivity) between two areas of the semiconductor membrane with a phononic structure coupled to the two adjacent pillars respectively attached to the different supports in order to obtain a minimal influence of the difference in temperature between these two zones. In the same way, a lower density of inclusions (in other words a higher thermal conductivity) may be left in the direction of orientation of the junctions in order to obtain a more uniform temperature along these junctions.

Thus, according to one embodiment, the lattice of inclusions, being symmetrical, comprises first orientation directions comprising a first density of inclusions and a second direction of orientation comprising a second density of inclusions lower than the first density, the strips of P-N junctions are parallel to the second orientation density, and the trace on one of the faces of a pillar situated on the other face is aligned according to the first directions of orientation with any one of the adjacent pillars situated on the one of the faces.

According to another embodiment, the pillars are distributed alternately staggered in an alternating manner on the two faces of the membrane, the pillars situated on each of the two faces of the membrane forming groups of squares, the trace on one of the faces of a pillar situated on the other face being situated at the center of a square of pillars situated on the one of the faces.

The generator is advantageously fabricated in an integrated manner, and according to another aspect, an integrated circuit is provided incorporating a thermo-electric generator such as defined hereinbefore.

BRIEF DESCRIPTION OF THE DRAWINGS

Other advantages and features of the invention will become apparent upon studying the detailed description of embodiments and their implementations, taken by way of non-limiting examples and illustrated by the appended drawings in which:

FIGS. 4 to 20 illustrate schematically various steps of one example of a method of fabrication of a thermo-electric generator.

DETAILED DESCRIPTION

Figure 1:
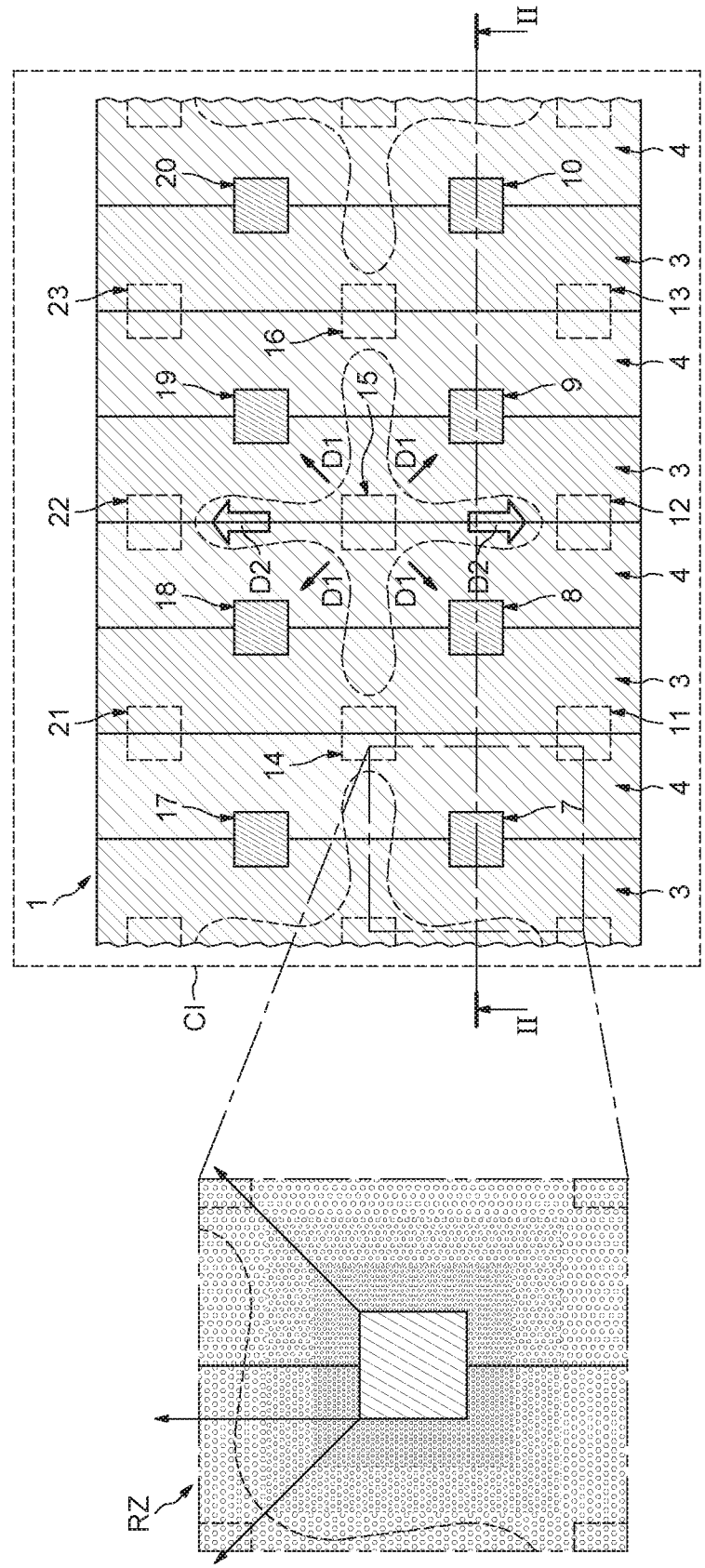
FIGS. 1 to 3 relate to various embodiments of a thermo-electric generator.
Figure 2:
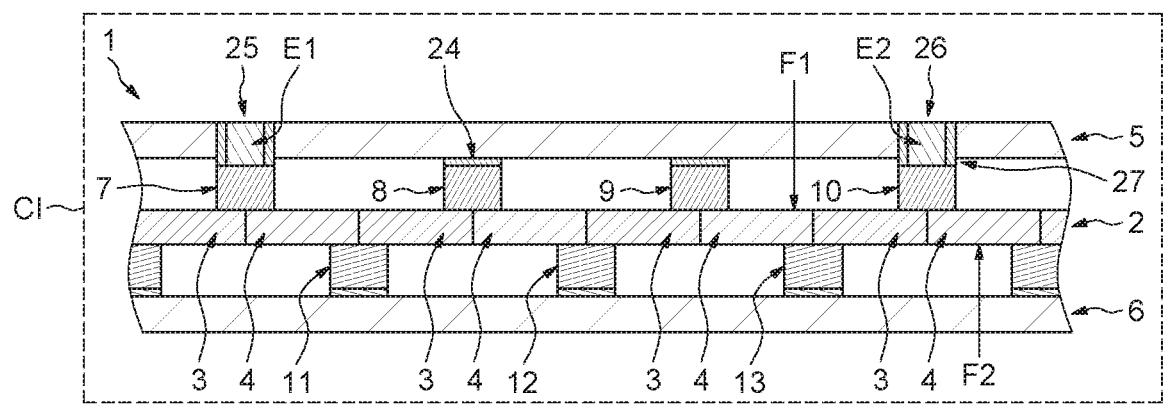
Figure 3:
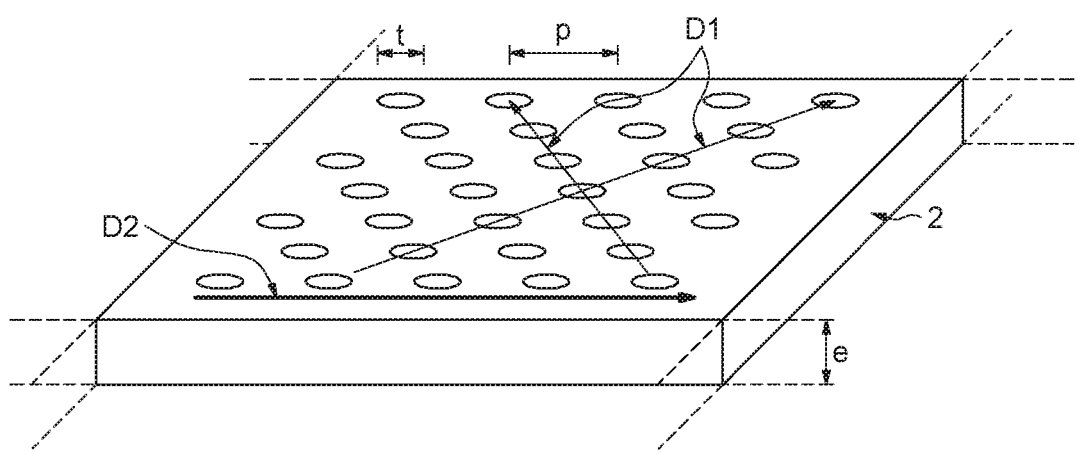

Reference is now made to FIGS. 1 to 3 in order to illustrate one embodiment of a thermo-electric generator incorporated within an integrated circuit CI.

FIG. 1 shows a top bird's-eye view of one embodiment of a thermo-electric generator 1. FIG. 2 is a cross-section along the line II-II in FIG. 1. FIG. 3 illustrates an enlargement of the lattice of inclusions of the suspended membrane with a phononic structure in FIG. 1.

With reference to FIGS. 1 and 2, it can be seen that the thermo-electric generator 1 here comprises a thin semiconductor membrane 2 with a planar geometry. The membrane 2 is said to be suspended: the membrane is held by pillars 7-23 between a first support 5 and a second support 6. The two supports 5 and 6 are designed to be coupled with a cold thermal source and a hot thermal source, respectively.

The hot source may for example be a hot part of an integrated circuit and the cold source may be a colder part of the integrated circuit.

As a variant, the hot source may for example be a pipe carrying a hot fluid and the cold source the ambient air.

If the generator is placed in a watch for example, the hot source can be the human skin and the cold source the ambient air.

Here, the membrane 2 is situated at an equal distance from the supports 5 and 6. This symmetry of the structure notably allows the formation of the membrane to be facilitated.

The membrane comprises an alternation of N and P doped strips 3, 4 forming several P-N junctions 3, 4 connected in series. Each P-N junction runs between a first face F1 of the membrane situated facing the first support 5 and a second face F2 of the membrane situated facing the second support 6.

The materials of two supports may be metal or silicon. For example, the support 6 can be a part of a silicon substrate formed in conventional CMOS fabrication processes.

Metal films, for example stainless steel or aluminum, may also be used for the supports 5 and 6.

The supports may be rigid or may exhibit a certain flexibility in the same way as the silicon membrane 2.

The pillars 7 to 23 are thermally and electrically conducting. Each pillar connects a P-N junction on one side and is isolated from the corresponding support by a thermally-conducting electrical insulator (e.g.: 24 for the pillar 8).

The pillars situated on the first face F1 comprise two electrically-conducting pillars referred to as contact pillars 25 and 26 coupled to two places E1, E2 on the support 5 so as to generate an electrical signal. They are isolated from the support 5 by a thermally-conducting electrical insulator (e.g.: 27 for the contact pillar 26).

When the supports 5 and 6 are respectively coupled to the cold source and to the hot source, the thermo-electric membrane 2 is subjected to a thermal gradient which generates a potential difference between the two locations E1 and E2.

The other pillars are in fact pillars referred to as connection pillars. The space between the face F2 and the support 6 only comprises connection pillars 11, 12, 13.

These pillars referred to as connection pillars 8, 9, 19, 11, 12, 13 contribute to redistributing the heat flux within the plane of the membrane near the P-N junctions.

As illustrated in FIGS. 1 and 2, the pillars 7 to 23 are distributed alternately staggered in an alternating manner on the two faces F1 and F2 of the membrane 2 (E.g.: the pillars 7, 8, 17, 18 on the face F1 and the pillar 14 on F2).

It can be seen that the pillars situated on each of the two faces of the membrane form groups of squares, for example the pillars 7, 8, 17 and 18.

The trace on the face F1 of the pillar 14 situated on the face F2 is situated at the center of the square of pillars 7, 8, 17 and 18 situated on the face F1.

Reference is now more particularly made to FIG. 3 in order to show examples of characteristic elements of a lattice of inclusions of the silicon membrane.

In order to conserve the electrical properties of the crystal lattice while at the same time reducing the propagation of the phonons, it is preferable to work in the ballistic regime, in other words to introduce a structure of inclusions with sizes less than the mean free path of the phonons (~200 nm at 300 K for silicon).

FIG. 3 shows a thin membrane of silicon with a phononic structure comprising a periodic set of patterns (inclusions) exhibiting a mechanical contrast with the material of the thin membrane. Thus, the inclusions can comprise a semiconductor material different from that of the membrane, for example Ge or SiGe, or be simply filled with air.

Furthermore, it is advantageous for the phononic structure to exhibit the following characteristics, taken in isolation or preferably in combination at least for some of them:
- a repetition pitch p less than the mean free path of the thermal phonons (~200 nm at 300 K in silicon) and greater than the wavelength of the thermal phonons (~2 nm at 300K in silicon);
- a symmetry of the lattice (hexagonal, square, etc.);
- a periodic size t of inclusions (phononic crystal) less than the mean free path of the thermal phonons and greater than the wavelength of the thermal phonons;
- a symmetrical inclusion shape (square, cylindrical, triangular).

Furthermore, the thickness e of the membrane also has an influence. Thus, this thickness is normally situated between 10 nm and 2 μm for silicon in order to have thermo-electric properties notably better than in the prior art.

Furthermore, another advantageous effect offered by the symmetry of the phononic structure within the semiconductor membrane illustrated in FIG. 3 is to induce properties dependent on the direction of propagation.

In other words, phononic modes of the same frequency acquire different speeds according to the direction of propagation.

In the case of the membrane with a phononic structure, this corresponds to the fact that the higher the density of inclusions in a direction of orientation, the lower will be the thermal conductivity in this direction.

In FIG. 3, the diagonal directions of orientation D1 have a maximum density of inclusions. As a consequence, the lowest thermal conductivities are obtained in these directions of orientation D1 (called direction of orientation of minimum thermal conductivity). The directions D2 having a lower density of inclusions have higher thermal conductivities.

Thus, the heat flux will be guided towards these directions D2 for a faster and more uniform redistribution of the heat flux along the P-N junctions.

Going back to FIG. 1, the enlarged area illustrates the structure of the lattice of inclusions RZ of the silicon membrane with a phononic structure 2. The lattice of inclusions is periodic and symmetrical. More precisely, this lattice of inclusions is in the shape of squares having a higher density of inclusions in the first directions D1 and a lower density in the second directions of orientation D2.

As can be seen in FIG. 1, the trace 14 on one of the faces (F1 for example) of a pillar 14 situated on the other face (F2) and any one of the adjacent pillars (7, 8, 17, 18) situated on the one of the faces (F1) are aligned along the first directions of orientation D1.

As a consequence, the thermal conductivity of the silicon membrane with a phononic structure between these pillars is minimized and higher performance thermo-electric properties and a greater difference in temperature are then obtained. Thus, the voltage generated by the thermo-electric generator will also be higher.

Furthermore, the directions of orientation D2 leading to the higher thermal conductivities are parallel to the junctions of the P-N junctions. For this reason, a more uniform temperature may be obtained in the junctions.

These thermal conductivity characteristics in combination with a redistribution of the heat flux in the plane of the membrane by virtue of the alternating distribution of the pillars allow a thermo-electric generator exhibiting improved performance characteristics to be obtained.

Examples of technological steps enabling one example of a thermo-electric generator to be fabricated are presented in FIGS. 4 to 20.

This embodiment is shown by way of illustration and is non-limiting. Several variants may be envisaged.

Figure 4:
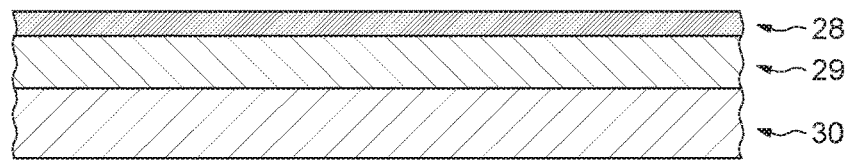

As illustrated in FIG. 4, a substrate of the silicon-on-insulator type is used here which is commonly denoted by those skilled in the art using the acronym "SOI" (Silicon On Insulator).

The substrate of the silicon-on-insulator type comprises a semiconductor film 28, for example made of silicon, situated on top of a buried insulating layer 29, commonly denoted using the acronym "BOX" (for Buried-OXide) itself situated on top of a carrier substrate 30, for example a semiconductor well.

The thickness of the film of silicon 28 determines the final thickness of the thermo-electric membrane 2. According to the features defined hereinbefore, it is preferable to have a thickness between 10 nm and 2 μm.

FIGS. 5 to 9 relate to the steps for the implantation of the film 28.

Figure 5:
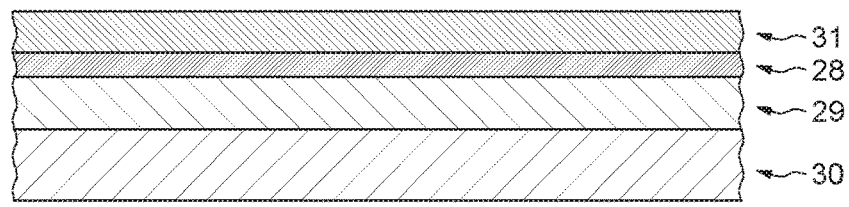

In FIG. 5, the process begins with the deposition of a layer of photosensitive resist 31 for preparing a photolithography 32 in the following step. A layer of negative inorganic resist known as HSQ may for example be used.

Figure 6:
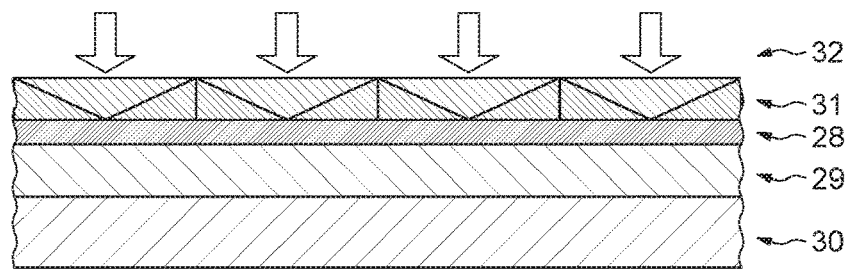
Figure 7:
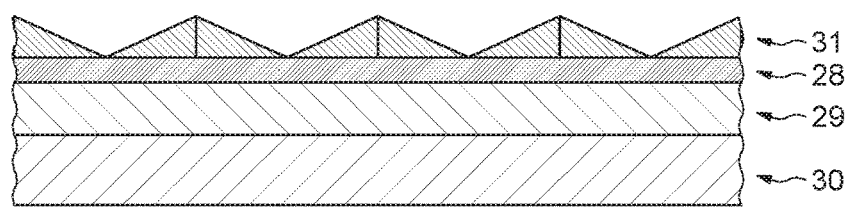

A photolithography using exposure gradient 32 is subsequently applied (FIG. 6). By applying laser direct writing, the various depths of exposure on the layer of resist 31 are then obtained.

The layer of photosensitive resist 31 now has, after development (FIG. 7), a variable thickness profile and it is used as a mask for the ion implantation dilution in the following step.

Figure 8:
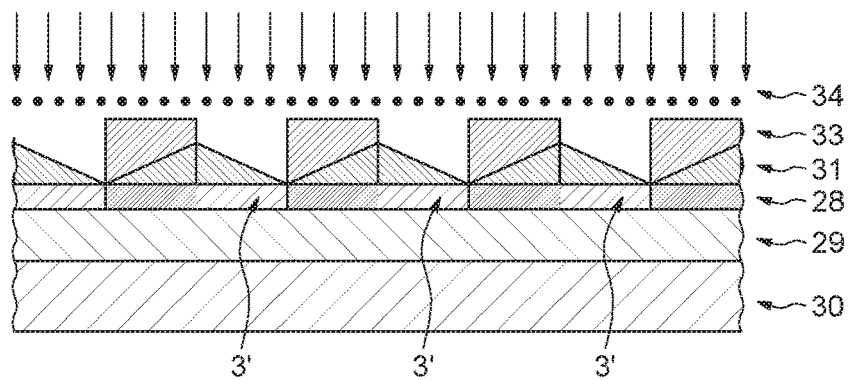

As illustrated in FIG. 8, a second organic resist 33 may be used (for example the resist known as SAL 601) having a selectivity with respect to the resist 31 used as a mask. Following a second level lithography and the development of the second resist 33, an implantation of dopants 34 of the N type is carried out. The vertical profile of the inorganic resist mask 31 allows the concentration of dopants to be modulated laterally so as to improve the thermo-electric efficiency.

Figure 9:
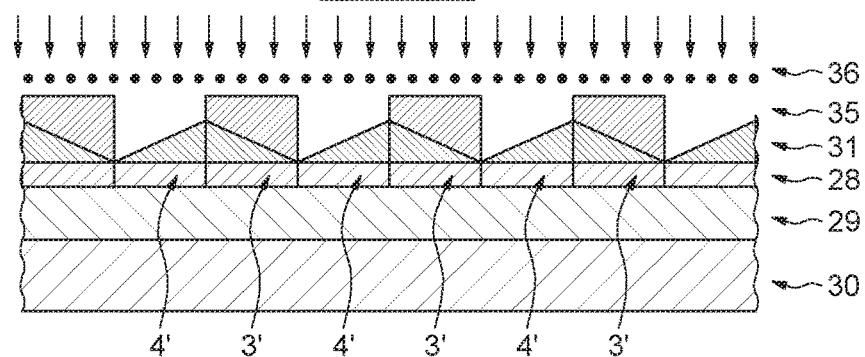

By analogy, a third level of lithography on a new layer of organic resist 35 (for example the resist known as SAL 601) and an implantation of dopants 36 of the P type are applied as illustrated in FIG. 9. An annealing of the film 28 is carried out in the end for the activation of the dopants.

In this way, P-N junctions 3', 4' have been formed coupled in series within the film 28 of silicon. They differ from the P-N junctions 3, 4 described hereinbefore by the fact that they do not yet possess a phononic structure.

It may be noted that the implantation of dopant elements with a modulation of concentration within the plane of the active membrane (film 28) is optional here. It could be implemented by the process of exposure gradient photolithography or by any other method allowing a dilution mask to be formed.

The formation of the phononic structure is illustrated in FIGS. 10 to 13.

Figure 10:
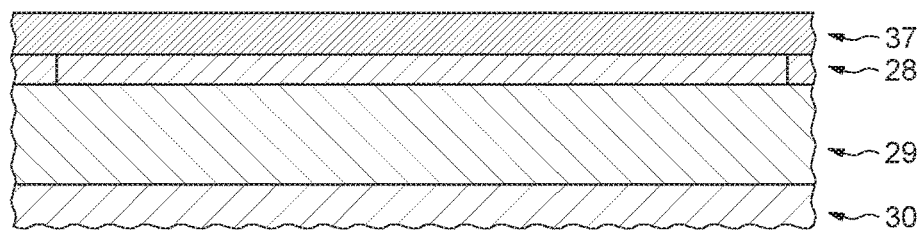

FIG. 10 is an enlargement of the area of P-type dopants 4' of the thin film 28. A layer of positive photosensistive or electro-sensitive resist 37 (for example the resist known as PMMA or ZEP520) is deposited on the thin film.

Figure 11:
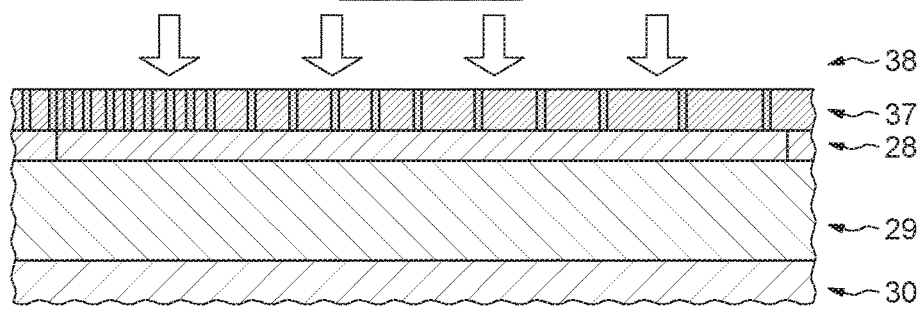

By carrying out an electron lithography 38 in the step illustrated in FIG. 11, the patterns of the phononic crystal can be obtained by electron writing.

Figure 12:
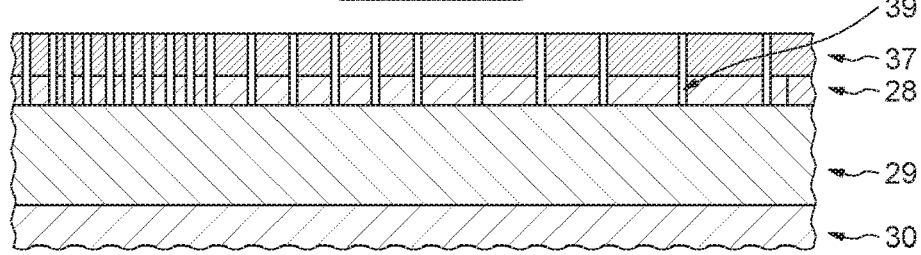

The areas exposed in the step illustrated in FIG. 11 are subsequently eliminated in the step shown in FIG. 12, then the silicon is etched so as to form the inclusions 39.

Alternatively, the formation of the phononic structure could be carried out by other structuring methods such as nano-printing followed by dry or wet etches.

Figure 13:
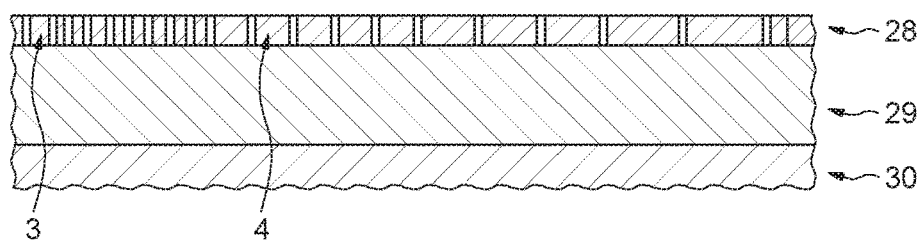

Finally, the layer of positive electro-sensitive resist is eliminated in the step shown in FIG. 13. As a result, the thermo-electric thin film 28 containing the P-N junctions (3, 4) with a phononic structure is formed.

The continuation of the fabrication of the thermo-electric generator is illustrated in FIGS. 14 to 20.

First of all, a deposition of a metal layer 40 is carried out on the phononic structured film, for example by a "PECVD" deposition, which determines the height of the pillars.

After having deposited a first layer of photosensitive resist, a structuring mask is used for determining the pillar geometry by optical lithography. A sputtering process is subsequently used to form a layer of electrical insulator 41 situated on top of the metal layer 40 and of the layer of structuring resist. The latter is removed by a process referred to as "Lift-Off" and the final micro-structuring of the pillars is carried out by photo-thermal laser ablation on the uncovered metal areas of the layer of thermally-conducting electrical insulator, as illustrated in FIG. 14.

Figure 15:
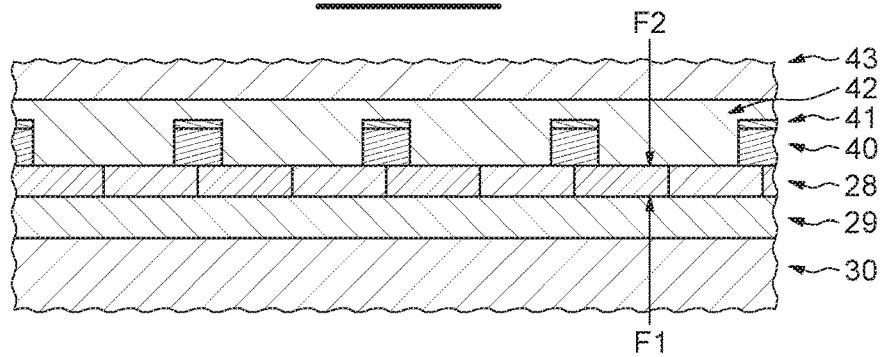

In FIG. 15, a layer of temporary adhesive resist 42 is deposited on the face F2 of the membrane comprising the metal pillars. A temporary support 43 composed of a material resistant to the later wet etch steps is subsequently bonded onto the layer of temporary adhesive resist 42.

Figure 16:
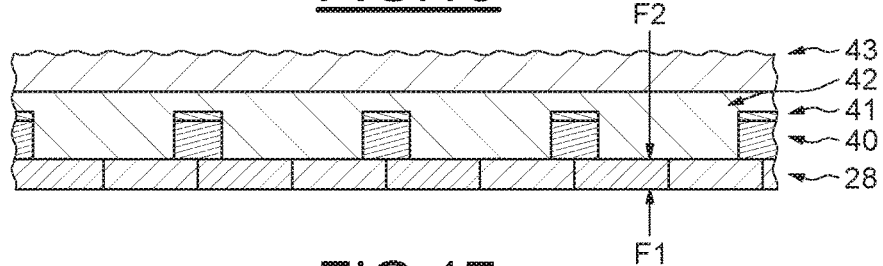

Physical and then chemical etch steps are then carried out in order to remove the silicon substrate 30 and the layer of oxide 29 from the SOI substrate. As a consequence, the thin film 28 is ready for the formation of the pillars on the face F1 as shown in FIG. 16.

Figure 14:
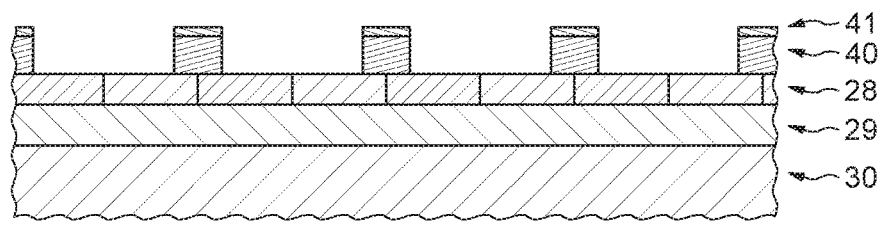
Figure 17:
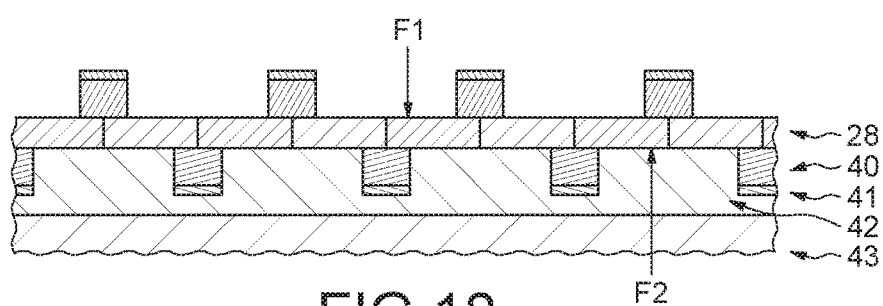

Metal pillars of the face F1 are formed in a manner analogous to that illustrated in FIG. 14. It may be noted that the metal pillars are implemented staggered in an alternating manner on the two faces of the film. Each pillar is coupled with a P-N junction and the pillars of two faces are not aligned on the same vertical plane as illustrated in FIG. 17.

It may also be noted that the thicknesses of pillars and of thermally-conducting electrical insulators on top of the pillars are identical on the two faces of the membrane.

Figure 18:
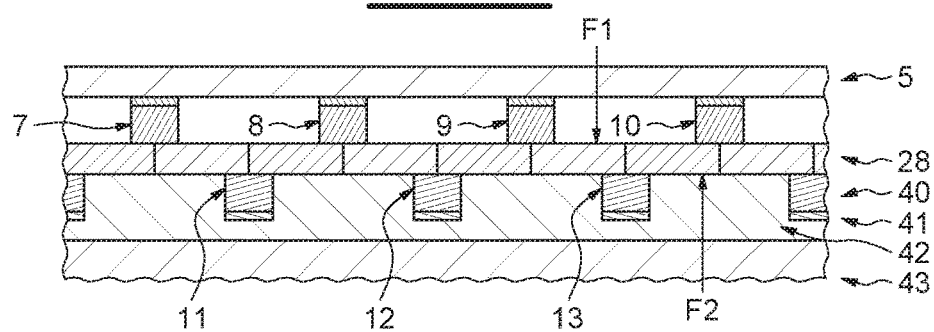

As illustrated in FIG. 18, the first support 5, for example a flexible metal foil (such as stainless steel, aluminum, etc. with a good thermal conductivity) designed to be coupled to a cold thermal source is deposited on the insulating layers situated on top of the metal pillars 7 to 10 of the face F1 by a conventional transfer and bonding step.

Conventionally, contact vias are subsequently formed for the electrical connection to the locations E1, E2 (FIG. 19).

Finally, the temporary adhesive resist 42 on the face F2 of the film can be dissolved in order to liberate it and to obtain the membrane 2 of the thermo-electric generator 1. The second support 6 designed to be coupled to a hot thermal source is formed in a manner analogous to that of the first support 5 (FIG. 20).

The integrated thermo-electric generator 1 is thus obtained comprising a suspended semiconductor membrane 2 with a phononic structure.

The invention claimed is:

1. A thermo-electric generator, comprising:
   a semiconductor membrane containing a plurality of P-N junctions;
   a first support;
   a second support;
   wherein the semiconductor membrane is suspended between the first support and the second support;
   wherein the first support includes a first through opening and a second through opening;
   a first electrically conducting pillar extending through the first through opening to make physical and electrical contact with a p-type region of the plurality of P-N junctions, said first electrically conducting pillar being electrically insulated from sidewalls of the first through opening; and
   a second electrically conducting pillar extending through the second through opening to make physical and electrical contact with an n-type region of the plurality of P-N junctions, said second electrically conducting pillar being electrically insulated from sidewalls of the second through opening.

2. The thermo-electric generator of claim 1, wherein the first support is configured to be coupled to a cold thermal source.

3. The thermo-electric generator of claim 1, wherein the second support is configured to be coupled to a hot thermal source.

4. The thermo-electric generator of claim 1, wherein the first and second electrically conducting pillars provide electrical output terminals at which a voltage potential is generated.

5. The thermo-electric generator of claim 1, wherein the plurality of P-N junctions of the semiconductor membrane comprise plural strips alternately of a P conductivity type and an N conductivity type forming the plurality of P-N junctions coupled in series, wherein said p-type region comprises one of the strips of the P conductivity type and wherein said n-type region comprises one of the strips of the N conductivity type.

6. The thermo-electric generator of claim 1, wherein the semiconductor membrane has a phononic structure comprising a lattice of inclusions of a compound different from the semiconductor material of the semiconductor membrane.

7. The thermo-electric generator of claim 6, wherein the lattice of inclusions is symmetrical and comprises a first orientation direction comprising a first density of inclusions and a second orientation direction comprising a second density of inclusions lower than the first density, wherein the plurality of P-N junctions extend parallel to the second orientation direction.

8. The thermo-electric generator of claim 6, wherein the lattice of inclusions is periodic with at least one repetition pitch less than a mean free path of thermal phonons and greater than a wavelength of the thermal phonons.

9. The thermo-electric generator of claim 8, wherein the lattice of inclusions comprises a succession of various repetition pitches of increasing size.

10. The thermo-electric generator of claim 8, wherein the lattice of inclusions comprises a succession of inclusions of increasing sizes.

11. The thermo-electric generator of claim 1, wherein the semiconductor membrane is spaced by equal distances from the first and second supports.

12. The thermo-electric generator of claim 1, wherein the first and second supports are rigid.

13. The thermo-electric generator of claim 1, wherein the first and second supports are flexible.

14. The thermo-electric generator of claim 1, fabricated as an integrated device.

15. The thermo-electric generator of claim 1, wherein the semiconductor membrane is suspended from the first support by a plurality of thermally-conducting, but electrically insulating, pillars, wherein each pillar has a first end in contact with a P-N junction of said plurality of P-N junctions and a second end in contact with the first support.

16. The thermo-electric generator of claim 15, wherein the plurality of thermally-conducting, but electrically insulating, pillars are in contact with alternating ones of the plurality of P-N junctions.

17. The thermo-electric generator of claim 1, wherein the semiconductor membrane is suspended from the second support by a plurality of thermally-conducting, but electrically insulating, pillars, wherein each pillar has a first end in contact with a P-N junction of said plurality of P-N junctions and a second end in contact with the second support.

18. The thermo-electric generator of claim 17, wherein the plurality of thermally-conducting, but electrically insulating, pillars are in contact with alternating ones of the plurality of P-N junctions.

19. The thermo-electric generator of claim 1:
wherein the semiconductor membrane is suspended from the first support by a plurality of thermally-conducting, but electrically insulating, first pillars that are in contact with first alternating ones of the plurality of P-N junctions on a first side of the semiconductor membrane; and
wherein the semiconductor membrane is suspended from the second support by a plurality of thermally-conducting, but electrically insulating, second pillars that are in contact with second alternating ones of the plurality of P-N junctions on a second side of the semiconductor membrane.

20. The thermo-electric generator of claim 19, wherein the first alternating ones of the plurality of P-N junctions are different from the second alternating ones of the plurality of P-N junctions.

21. A thermo-electric generator, comprising:
a semiconductor membrane containing a plurality of P-N junctions;
a first support;
a second support;
wherein the semiconductor membrane is suspended between the first support and the second support;
wherein the semiconductor membrane is suspended from the first support by a plurality of thermally-conducting first pillars, each first pillar having a first end in direct contact with first alternating ones of the plurality of P-N junctions on a first side of the semiconductor membrane and having a second end and further including an insulating layer for electrically insulating the second end of the first pillar from the first support; and
wherein the semiconductor membrane is suspended from the second support by a plurality of thermally-conducting second pillars, each second pillar having a first end in direct contact with second alternating ones of the plurality of P-N junctions on a second side of the semiconductor membrane and having a second end and further including an insulating layer for electrically insulating the second end of the second pillar from the second support.

22. The thermo-electric generator of claim 21, wherein the first alternating ones of the plurality of P-N junctions are different from the second alternating ones of the plurality of P-N junctions.

23. The thermo-electric generator of claim 21, further comprising:
a first through opening extending through the first support;
a second through opening extending through the first support;
a first electrically conducting pillar extending through the first through opening to make physical and electrical contact with a p-type region of the plurality of P-N junctions, said first electrically conducting pillar being electrically insulated from sidewalls of the first through opening; and
a second electrically conducting pillar extending through the second through opening to make physical and electrical contact with an n-type region of the plurality of P-N junctions, said second electrically conducting pillar being electrically insulated from sidewalls of the second through opening.

24. The thermo-electric generator of claim 23, wherein the first and second electrically conducting pillars provide electrical output terminals at which a voltage potential is generated.

25. The thermo-electric generator of claim 21, wherein the first support is configured to be coupled to a cold thermal source.

26. The thermo-electric generator of claim 21, wherein the second support is configured to be coupled to a hot thermal source.

27. The thermo-electric generator of claim 21, wherein the plurality of P-N junctions of the semiconductor membrane comprise plural strips alternately of a P conductivity type and an N conductivity type forming the plurality of P-N junctions coupled in series.

28. The thermo-electric generator of claim 21, wherein the semiconductor membrane has a phononic structure comprising a lattice of inclusions of a compound different from the semiconductor material of the semiconductor membrane.

29. The thermo-electric generator of claim 28, wherein the lattice of inclusions is symmetrical and comprises a first orientation direction comprising a first density of inclusions and a second orientation direction comprising a second density of inclusions lower than the first density, wherein the plurality of P-N junctions extend parallel to the second orientation direction.

30. The thermo-electric generator of claim 28, wherein the lattice of inclusions is periodic with at least one repetition pitch less than a mean free path of thermal phonons and greater than a wavelength of the thermal phonons.

31. The thermo-electric generator of claim 30, wherein the lattice of inclusions comprises a succession of various repetition pitches of increasing size.

32. The thermo-electric generator of claim 30, wherein the lattice of inclusions comprises a succession of inclusions of increasing sizes.

33. The thermo-electric generator of claim 21, wherein the semiconductor membrane is spaced by equal distances from the first and second supports.

34. The thermo-electric generator of claim 21, wherein the first and second supports are rigid.

35. The thermo-electric generator of claim 21, wherein the first and second supports are flexible.

36. The thermo-electric generator of claim 21, fabricated as an integrated device.

* * * * *